United States Patent [19]

Asmussen et al.

[11] Patent Number: 4,551,414
[45] Date of Patent: Nov. 5, 1985

[54] POSITIVE RESIST MATERIAL

[75] Inventors: Frithjof Asmussen; Hideto Sotobayashi; Jiang-Tsun Chen; Wolfram Schnabel, all of Berlin, Fed. Rep. of Germany

[73] Assignee: Max-Planck-Gesellshaft zur Förderung der Wissenschaften e.V., Göttingen, Fed. Rep. of Germany

[21] Appl. No.: 463,437

[22] Filed: Feb. 3, 1983

[30] Foreign Application Priority Data

Feb. 24, 1982 [DE] Fed. Rep. of Germany ....... 3206633
Dec. 17, 1982 [DE] Fed. Rep. of Germany ....... 3246825

[51] Int. Cl.$^4$ .............. G03C 1/495; G03C 5/16; G03C 18/02; G03C 18/20
[52] U.S. Cl. .................................. 430/270; 526/245; 430/326; 430/330; 430/327; 430/296; 430/942; 430/967; 430/331
[58] Field of Search ............... 430/270, 296, 326, 330, 430/327, 942, 967, 331; 526/245; 204/159.14, 159.22

[56] References Cited

U.S. PATENT DOCUMENTS

| | | | |
|---|---|---|---|
| 4,061,832 | 12/1977 | Roberts | 204/159.22 X |
| 4,096,290 | 6/1978 | Fredericks | 427/273 X |
| 4,125,672 | 11/1978 | Kakuchi et al. | 430/5 |
| 4,268,590 | 5/1981 | Eranian et al. | 430/296 X |
| 4,273,856 | 6/1981 | Yoneda et al. | 430/270 |
| 4,276,365 | 6/1981 | Yoneda et al. | 430/270 |

OTHER PUBLICATIONS

Tsuka Tada, "Crosslinked Poly(2,2,2-Trichloroethyl Methacrylate) as a Highly Sensitive Positive Electron Resist," *Journal of the Electrochemical Society*, vol. 126, No. 9, Sep. 1979, pp. 1635–1636.
Masami Kakuchi et al., "Poly (Fluoro Methacrylate) as Highly Sensitive, High Contrast Positive Resist", *Journal of the Electrochemical Society*, vol. 124, No. 10, Oct. 1977, pp. 1648–1651.
"Copolymers", *Kirk–Othmer Encyclopedia of Chemical Technology*, Third Edition, vol. 6, John Wiley & Sons, Inc., New York, 1979, pp. 798–799.
Gessner G. Hawley, ed., "Copolymer", *The Condensed Chemical Dictionary*, Eighth Edition, Van Nostrand Reinhold Company, New York, 1971, p. 233.
H. Bennett, ed., "Copolymer", *Concise Chemical and Technical Dictionary* (Third edition) Chemical Publishing Co., Inc. New York, NY, 1974, p. 279.
Robert T. Morrison and Robert N. Boyd, *Organic Chemistry*, Third Edition, Allyn and Bacon, Inc., Boston, Mass., 1973, p. 1033.

*Primary Examiner*—John E. Kittle
*Assistant Examiner*—Cynthia Hamilton
*Attorney, Agent, or Firm*—Felfe & Lynch

[57] ABSTRACT

The invention relates to positive resist materials of thermally crosslinkable methacrylic polymers soluble in organic solvents, which are characterized in that the methacrylic polymers are copolymers of 80 to 98 mol-% of fluoroalkylmethacrylate and 20 to 2 mol-% of methacrylic acid chloride or chloroalkylmethacrylate. The resists of the invention are very well suited for the transfer of microstructures, for example in semiconductor technology. They have, in addition to a high sensitivity, a very good mechanical stability and strength of adhesion.

7 Claims, 1 Drawing Figure

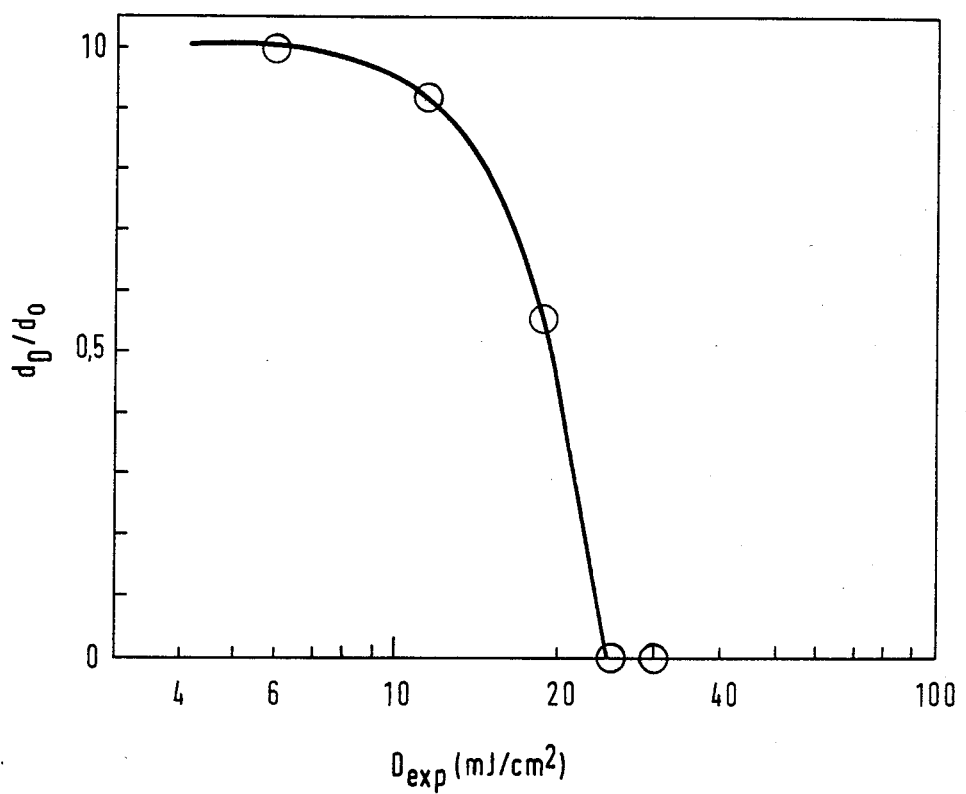

POSITIVE RESIST MATERIAL

DESCRIPTION

The invention relates to a positive, thermally crosslinkable resist material.

Resists form radiation-sensitive films whose solubility changes upon being exposed to energy-rich radiation. Two types of resist are distinguished, according to whether the solubility of the film coatings is reduced ("negative resists") or increased ("positive resists"). In the former case, after exposure, the unexposed parts are removed with a suitable solvent, and in the second case the exposed parts are removed. The resists are applied in a thin coating to the material surface and, after the exposure, performed, for example, through a masking pattern, and the washing-out process (development), they serve for the structuration of material surfaces, e.g., by etching or electroplating. Resists are used especially in semiconductor technology (very large scale integration=VLSI), in the manufacture of electronic components (printed circuits, integrated circuits) and in printing technology (preparation of half-tone printing plates).

For the transfer of extremely small structures, for example to semiconductor components for microelectronics, a number of resists have become known. In U.S. Pat. Nos. 3,535,137 and 3,779,806, polymethacrylic acid esters are described as resists whereby a given pattern can be transferred to a substrate by means of electron beams. From German Offenlegungsschrift 2,610,301 there is known a positively acting, thermally crosslinkable resist which contains an alkyl methacrylate-methacrylic acid chloride copolymer. One disadvantage of these resists on the basis of polymethacrylic acid esters or alkyl methacrylate-methacrylic acid chloride copolymers is their low sensitivity. From German Offenlegungsschrift, 2,702,427 and Japanese Pat. Nos. 55-24088 and 53-100774, resists on the basis of halogenated polymethacrylic acid esters are known, which do have a higher sensitivity to energy-rich radiation, but which do not have satisfactory strength of adhesion to the substrate.

It is therefore the object of the invention to overcome the known disadvantages and prepare a resist having a combination of special desired resist properties and having especially, in addition to a high sensitivity to radiation, a sufficient mechanical stability and strength of adhesion to the substrate. This object is achieved by the present invention.

The subject of the invention is a positive resist material consisting of a thermally crosslinkable methacrylic polymer which is soluble in an organic solvent and which is characterized by the fact that the methacrylic polymer is a copolymer of 80 to 98 mole-% of fluoroalkylmethacrylate and 20 to 2 mole-% of methacrylic acid chloride (a) or chloroalkylmethacrylate (b).

For the above case (a) (flouroalkylmethacrylate and methacrylic acid chloride) the copolymer is especially one of the general formula

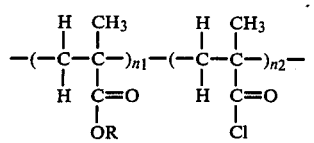

wherein R represents a wholly or partially flourinated alkyl group, preferably with 1 to 9 carbon atoms, $n_1$ and $n_2$ are whole numbers, the degree of polymerization $n=n_1+n_2$ is between 300 and 3000 and the mole fraction of the methacrylic acid $n_2/n$ is between 0.02 and 0.20, and wherein 5 to 50% of the acid chloride groups can be in the form of carboxyl groups;

for the above (b) (flouroalkylmethacrylate and chloroalkylmethacrylate) the copolymer is especially one of the general formula

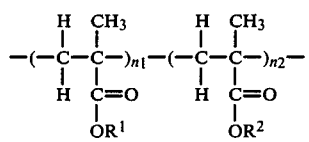

wherein $R^1$ represents a wholly or partially fluorinated alkyl group, preferably with 2 to 6 carbon atoms, $R^2$ a partially chlorinated alkyl group, preferably with 2 to 6 carbon atoms, with an $\omega$-trichloromethyl group, the degree of polymerization $n=n_1+n_2$ is between 300 and 3000 and the mole fraction $n_2/n$ is between 0.02 and 0.20.

A fluorinated alkyl group R or $R^1$ can be wholly or partially fluorinated, and branched or preferably straight-chained. It is especially a hexafluoralkyl group and primarily 2,2,3,4,4,4-hexafluorobutyl.

A partially chlorinated alkyl group $R^2$ having a terminal $\omega$-trichloromethyl group can be branched, or preferably straight-chained. It is, for example, 2,2,2-trichloroethyl.

The copolymers are randomly composed of the comonomers.

In the thermal treatment, the resists can be crosslinked with the formation of intermolecular bonds to such an extent that they are insoluble for a specific developer. The degree of crosslinking in this case is determined by the temperature and the time of the thermal crosslinking and by the concentration of the crosslinkable groups. As a rule, for copolymers (a) of fluoroalkylmethacrylate and methacrylic acid chloride, the crosslinking temperature is between 100° and 170° C. and the time between 30 minutes, and for copolymers (b) of fluoroalkylmethacrylate the temperature is between 180° and 250° C. and the time between 30 and 90 minutes.

For the above case (a) (fluoroalkylmethacrylate and methacrylic acid chloride) some of the acid chloride groups of the copolymer react with the residual moisture present in the organic solvent during contact with the latter, in a polymer-like reaction, with the formation of carboxyl groups which are needed in the thermal crosslinking (prebaking process) with the formation of anhydride groups. These reactions are explained by the following diagrammatic representation of the formation of carboxyl groups (1) and intermolecular anhydride groups (2):

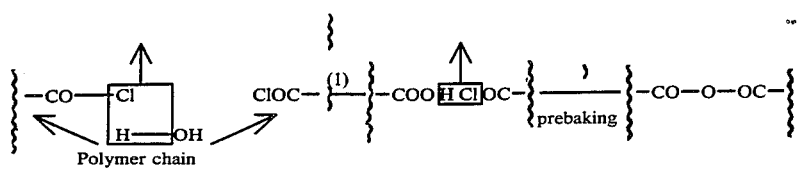

If the amount of water present in the organic solvent should not suffice for this purpose, the copolymer solution can be set aside with a comparatively small amount of water (preferably in an inert gas atmosphere, e.g., under nitrogen) until a sufficient thermal crosslinking of the resist can be achieved. 5 to 50% of the acid chloride groups can be in the form of carboxyl groups.

For the case (b) (fluoroalkylmethacrylate and chloroalkylmethacrylate), it is apparent from a publication of T. Tada (J. Electrochem. Soc. 126, 1635 (1979)) that poly2,2,2-trichloroethylmethacrylate can be crosslinked chemically by thermal treatment, and that the mechanical properties are changed and the solubility in solvents is impaired by this. The complete crosslinking involving all macromolecules brings about insolubility and a strong adhesion of the resist to the substrate. The mechanism of the crosslinking is still not understood.

The resist solution can be obtained in accordance with the invention by dissolving the copolymer in an inert organic solvent. Any inert organic solvent dissolving the copolymers of the invention can be used as solvent; preferably methyl ethyl ketone, methyl isobutyl ketone and/or butyl acetate can be used as solvents. The dissolution is performed preferably at room temperature or slightly elevated temperature. The concentration of the copolymer in the solvent amounts preferably to 5 to 20 wt.-%.

For the use of the resist material of the invention as a "positive resist" for the structuration of material surfaces, which represents additional subject matter of the invention, it is desirable to proceed by applying it to the substrate in a thin coating, preferably of a thickness of 0.3 to 3.0 micrometers, which can be accomplished by spinning on (spin-coating) a solution, for example, then thermally crosslinking the coating (prebaking process), and thereafter exposing it to energy-rich radiation, using, in the case of X-rays, a mask of a given pattern, and dissolving the exposed part with a developer. By the exposure to energy-rich radiation, bonds in the principal chains as well as crosslinking points are destroyed. This makes the resist material at the exposed places soluble in the developer. The exposure is performed preferably with X-rays, electron beams, or also ion beams. An organic solvent can be used as the developer, e.g., a solvent or solvent mixture suitable for the preparation of the resist material. In accordance with the invention, 2-propanol, a mixture of propanol-(2) and methyl isobutyl ketone or a mixture of 2-propanol and methyl ethyl ketone is used preferentially as developer. A special advantage of the present invention is that pure 2-propanol can be used as developer. This makes it possible to avoid the solvent mixtures frequently used as developers. The use of solvent mixtures as developers is often problematical. The developing time is the same as the developing times commonly used for resists. It amounts generally to about 1 to 2 minutes.

With the positive resist materials of the invention, resists are prepared which, in addition to high sensitivity, have also very good mechanical stability and strength of adhesion. They are therefore superior to the formerly known resists on a methacrylic basis. In comparison with a resist on the basis of polymethylmethacrylate, the resists of the invention have a sensitivity that is higher by a factor of 12 to 20. The resist made from fluoroalkylmethacrylate and chloroalkylmethacrylate furthermore has a very great shelf life at room temperature. On the basis of their high contrast factor, the resist materials are suitable for the imaging of fine structures. The resists of the invention are very well suited for the substrate materials commonly used in X-ray lithography, such as silicon, silicon dioxide, chromium, aluminum, titanium, GaAs etc.

The following examples will further explain the invention without limiting it to them.

EXAMPLE 1

Purification of the Monomers

The apparatus needed for the distillation is carefully freed of water and kept under a constant stream of nitrogen. 10 g of methacrylic acid chloride is treated in the distillation flask with 1 g of copper powder and distilled out at a pressure of 60 mbar through a column at a temperature of 30° to 33° C. The middle fraction is collected and used as the monomer for the polymerization.

100 g of 2,2,3,4,4,4-hexafluorobutylmethacrylate is washed in a separatory funnel with 20 ml of 10% caustic soda solution for destabilization, then washed with water to a neutral reaction, and, after separation of the phases, it is dried with calcium chloride. The ester is then distilled out through a column at a pressure of 23 mbar and a temperature of 60° to 63° C. The middle faction is used for the polymerization.

EXAMPLE 2

Copolymerization of 2,2,3,4,4,4-hexafluorobutylmethacrylate with methacrylic acid chloride A bomb tube is carefully freed of the water adsorbed onto the glass surface, filled with 30 g of 2,2,3,4,4,4-hexafluorobutylmethacrylate, 0.376 g of methacrylic acid chloride and 0.072 g of benzoyl peroxide, and sealed off with the exclusion of moisture. The polymerization takes place at a temperature of 80° C. for 24 hours. The polymer is dissolved in dry methyl ethyl ketone, precipitated with dry benzine (boiling range 50° to 75° C.) and freed of the solvent in vacuo. The yield is about 90%. The determination of the molecular weight by gel permeation chromatography gave a value $\overline{M}_w = 640,000$ with $\overline{M}_3/\overline{M}_n = 7.5$. The value measured for the molecular weight relates to a calibration with specific polymethyl methacrylate fractions. The relatively broad distribution prior to the crosslinking does not impair the varnishing properties, because after the prebaking process the resist is in the crosslinked state (very high molecular weight). The glass transition temperature was measured at 58° C. in the differential scanning calorimeter.

EXAMPLE 3

Reaction of acid chloride groups to carboxyl groups

A portion of the free acid chloride groups reacts with the slight residual moisture of the organic solvent even during the dissolving and precipitation process to form carboxyl groups which are needed in the prebaking process (110° C., 15 minutes) for the anhydride crosslinking. If this reaction with water should still be insufficient, the copolymer solution is let stand in a nitrogen atmosphere with a small amount of water until a crosslinking of the varnish can be achieved in the prebaking process. For further use it is desirable to dry the resist material and store it in a cool and dark place.

EXAMPLE 4

Application

For the preparation of the resist solution, 15 g of the copolymer prepared in accordance with the foregoing examples is dissolved in 85 g of methyl isobutyl ketone. The solution is spun onto the substrate at 2000 rpm. A film thickness of 0.9 micrometer is obtained. For the crosslinking, the resist is prebaked for 15 minutes at 110° C. The film has a very good mechanical stability and strength of adhesion.

The sensitivity of the resist was determined both with synchrotron beams and with electron beams (20 kV). The Doris storage ring (Deutsche Elektronen-Synchrotron, Hamburg) with an electron energy of 1.5 GeV served as the source of the synchrotron radiation. The wavelength of the energy maximum of the synchrotron radiation behind a 7.5 micrometer Kapton filter was $\lambda_{max}=0.8$ nm.

The sensitivity test was performed with a film thickness of 0.5 micrometers. The developing time was 90 seconds. 2-Propanol was used as developer. The following sensitivities were found:

Synchrotron beams: $D_S=45$ mJ/cm$^2$.
Electron beams (20 kV): $D_E=0.4$ μC/cm$^2$.

In comparison to polymethylmethacrylate, the resist of the invention has a sensitivity that is higher by a factor of 12.

EXAMPLE 5

Preparation of 2,2,2-trichloroethylmethacrylate by azeotropic transesterification 224 g (1 mole) of trichloroethanol, 5 g of concentrated sulfuric acid, 300 g of benzene and 5 g of hydroquinone are added to 100 g (1 mole) of undestabilized methacrylic acid methyl ester. The mixture is held at ebullition for 24 hours in an azeotropic distillation apparatus. The methanol that forms is distilled out. After the reaction has ended the solvent (benzene) and the unreacted remainder of methacrylic acid methyl ester and 2,2,2-trichloroethanol is separated from the reaction mixture by distillation. The product is fractionated by vacuum distillation. The middle fraction (b.p. 74°–76° C., 16 mbar) is used for the copolymerization.

EXAMPLE 6

Copolymerization of 2,2,3,4,4,4-hexafluorobutylmethacrylate with 2,2,2-trichloroethylmethacrylate A bomb tube is filled with 4.76 g of a 2,2,3,4,4,4-hexafluorobutylmethacrylate, 0.22 g of 2,2,2-trichloroethylmethacrylate (Example 5) and 12 mg of benzoyl peroxide with the exclusion of moisture and oxygen, and sealed shut. The polymerization is performed for 23 hours at a temperature of 80° C. The polymer is dissolved in methyl ethyl ketone, precipitated with benzine and vacuum-dried. The yield is approximately 45%.

The average molecular weight was determined to be $M_w=2.0\times10^5$; $M_w/M_n=2.6$.

EXAMPLE 7

Application

Coating of substrate surfaces

For the coating of substrate surfaces, the copolymer prepared in accordance with Example 6 is dissolved in a suitable solvent and after the solution has been applied, preferably by the spin-coating method, the solvent is evaporated. A film of a thickness of 1 micrometer is obtained, for example, by spinning the copolymer in methyl isobutyl ketone (100 g/kg) onto the substrate at 2000 rpm. The films are then heated for 30 minutes at a temperature between 180 and 240° C. under nitrogen. In the exposure experiments to be described below, films were used which had been heated at 200° C.

Radiation sensitivity and contrast

To determine the sensitivity and the contrast factor, the films were exposed to synchrotron radiation. The source of the radiation was the Bessy storage ring (Berliner Elektronenspeicherring-Gesellschaft f Synchrotronstrahlung, Berlin) with an electron energy of 750 MeV. The wavelength of the energy maximum of the synchrotron radiation behind a 7.5 micrometer Kapton filter and 9 micrometers of silicon was $\lambda_{max}=0.8$ nm corresponding to 1.55 keV. The development was performed at 23° C. in 2-propanol. The developing time was 90 seconds. Using films of the initial thickness $d_0=0.8$ μm, the sensitivity was found to be $D_S=25\pm5$ mJ/cm$^2$, i.e., the copolymer has a sensitivity about 20 times greater than polymethylmethacrylate (PMMA). The contrast factor is $\lambda=4.5$. In the case of PMMA, $\lambda=2.9$.

FIG. 1 shows the relative reduction of the coating thickness as a function of the radiation dose (gradation curve) for the copolymer of 2,2,3,4,4,4-hexafluorobutylmethacrylate and 2,2,2-trichloroethylmethacrylate (5.3 mol-%). Initial coating thickness $d_0=0.8$ μm, $d_D$: coating thickness remaining after radiation and development, developer: propanol-(2), developing time: 90 seconds.

Strength of adhesion

Tests for strength of adhesion were performed by the grid cutting test method pursuant to DIN 53151 using the grid cutting test apparatus of Erichsen, Model 295, on resist films 1 micrometer thick. The substrate was a glass microscope slide. The results obtained with films of poly-2,2,3,4,4,4-hexafluorobutylmethacrylate-co-2,2,2-trichloroethylmethacrylate (95:5 mol-%), poly-2,2,3,4,4,4-hexafluorobutylmethacrylate (FBM 110, Daikin Kogyo Co.) and polymethylmethacrylate (Esschem) are given in Table 1. While in the case of the homopolymer FBM 110 the Gt-0-B value is 0%, i.e., all of the squares produced by the grid cut are considerably damaged, the Gt-0-B value in the case of the copolymer MFCE is 98%, i.e., only a very small percentage of the squares shows pronounced edge damage.

Comparison with PMMA shows that the homopolymer FBM 110 has a poorer strength of adhesion than PMMA, when the prebaking temperature amounts to 140° C., as it usually does in practice with this substance.

Films of FBM 110 prebaked at 200° C. perform as regards strength of adhesion similarly to films of PMMA which are prebaked at 140° C.

TABLE 1

Strength of adhesion of resist films on glass, measured by the grid cutting test method of DIN standard 53151

| Grid cutting Characteristic[a] | Polymers | | | |
|---|---|---|---|---|
| | PMMA[b] | FBM 110[c] A | FBM 110[c] B | MFCE[d] |
| Gt-0-B | 0% | 0% | 0% | 98% |
| Gt-1-B | 96% | 72% | 99% | 2% |
| Gt-2-B | 4% | 28% | 1% | 0% |

[a]In grid cutting, a certain number of squares is produced of a size of 1 × 1 mm. A determination is made of the percentage of squares that has remained undamaged (Gt-0-B), the percentage of squares whose area has been reduced by up to 5% by chipping (Gt-1-B) and by 5 to 15% (Gt-2-B).
[b]Polymethylmethacrylate, prebaking: 150° C., 30 min.
[c]Poly-2,2,3,4,4,4-hexafluorobutylmethacrylate, prebaking: 140° C., 30 min (A), 200° C., 30 min (B).
[d]Poly-2,2,3,4,4,4-hexafluorobutylmethacrylate-co-2,2,2-trichloroethylmethacrylate (95:5), prebaking: 200° C., 30 min.

We claim:

1. A positive resist material of a thermally crosslinkable methacrylic polymer soluble in an organic solvent wherein the methacrylic polymer is a copolymer of the formula

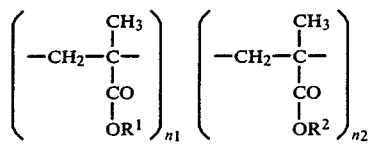

wherein R¹ represents a wholly or partly fluorinated alkyl group with 2 to 6 carbon atoms, R² represents a partially chlorinated alkyl group with 2 to 6 carbon atoms and having a terminal ω-trichloromethyl group, the degree of polymerization $n_1+n_2$ being between 300 and 3000 and the mole fraction $$\frac{n_2}{n_1+n_2}$$

being between 0.02 and 0.20.

2. The resist material of claim 1 wherein the chlorinated alkyl group is 2,2,2-trichloroethyl.

3. The resist material of claim 1 wherein the fluorinated alkyl group is a hexafluoroalkyl group.

4. The resist material of claim 3 wherein the fluorinated alkyl group is the 2,2,3,4,4,4-hexafluoro butyl group.

5. A method of forming a positive resist which comprises applying onto a support a thin coating of a thermally crosslinkable methacrylic polymer which is a copolymer of the formula

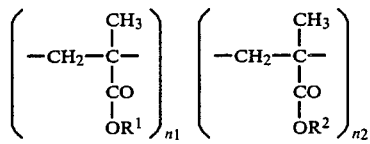

wherein R¹ represents a wholly or partly fluorinated alkyl group with 2 to 6 carbon atoms, R² represents a partially chlorinated alkyl group with 2 to 6 carbon atoms and having a terminal ω-trichloromethyl group, the degree of polymerization $n_1+n_2$ being between 300 and 3000 and the mole fraction $$\frac{n_2}{n_1+n_2}$$

being between 0.02 and 0.20; heating the coating for a period of 30 to 90 minutes at a temperature of 180° to 250° C.; exposing a part of the coating to high energy radiation; and developing the resist by dissolving the exposed part with a developer.

6. The method of claim 5, wherein the irradiation is performed with X-rays, electron beams or ion beams.

7. The method of claim 5, wherein the developing is Performed with propanol-(2), a mixture of 2-propanol and methyl isobutyl keton or a mixture of 2-propanol and methyl ethyl ketone.

* * * * *